(12) United States Patent
Liao

(10) Patent No.: US 9,590,039 B2
(45) Date of Patent: Mar. 7, 2017

(54) SEMICONDUCTOR STRUCTURE AND METHOD FOR FORMING THE SAME

(71) Applicant: UNITED MICROELECTRONICS CORP., Hsinchu (TW)

(72) Inventor: Wei-Shan Liao, Yunlin County (TW)

(73) Assignee: UNITED MICROELECTRONICS CORP., Hsinchu (TW)

(*) Notice: Subject to any disclaimer, the term of this patent is extended or adjusted under 35 U.S.C. 154(b) by 222 days.

(21) Appl. No.: 14/136,113

(22) Filed: Dec. 20, 2013

(65) Prior Publication Data

US 2015/0179779 A1    Jun. 25, 2015

(51) Int. Cl.
*H01L 29/735* (2006.01)
*H01L 29/08* (2006.01)
*H01L 29/66* (2006.01)
*H01L 29/732* (2006.01)
*H01L 29/06* (2006.01)
*H01L 29/10* (2006.01)

(52) U.S. Cl.
CPC ...... *H01L 29/0821* (2013.01); *H01L 29/0692* (2013.01); *H01L 29/10* (2013.01); *H01L 29/66272* (2013.01); *H01L 29/732* (2013.01)

(58) Field of Classification Search
CPC ............. H01L 27/0259; H01L 27/0921; H01L 29/0619; H01L 29/1045; H01L 29/7835

USPC ............ 257/E29.255, 565, E21.537, E29.02, 257/E29.174, E29.215; 327/565
See application file for complete search history.

(56) References Cited

U.S. PATENT DOCUMENTS

| | | | | |
|---|---|---|---|---|
| 5,132,235 A | * | 7/1992 | Williams | ................ H01L 21/74 148/DIG. 85 |
| 2005/0269597 A1 | * | 12/2005 | Williams | ............ H01L 21/8224 257/199 |
| 2008/0203534 A1 | * | 8/2008 | Xu | ....................... H01L 27/0259 257/577 |
| 2011/0121428 A1 | * | 5/2011 | Lin | ..................... H01L 29/0804 257/592 |
| 2012/0098096 A1 | * | 4/2012 | Lin | ..................... H01L 29/6625 257/565 |
| 2013/0320498 A1 | * | 12/2013 | Salcedo | ................ H01L 29/747 257/565 |

* cited by examiner

*Primary Examiner* — David Vu
*Assistant Examiner* — Jonathan Han
(74) *Attorney, Agent, or Firm* — WPAT, PC; Justin King

(57) ABSTRACT

A semiconductor structure and a method for forming same are provided. The semiconductor structure includes a bipolar transistor. The bipolar transistor includes a base doped contact, an emitter doped contact, a collector doped contact, and well regions. The base doped contact, the emitter doped contact and the collector doped contact are formed in the different well regions having different dopant conditions from each other.

9 Claims, 6 Drawing Sheets

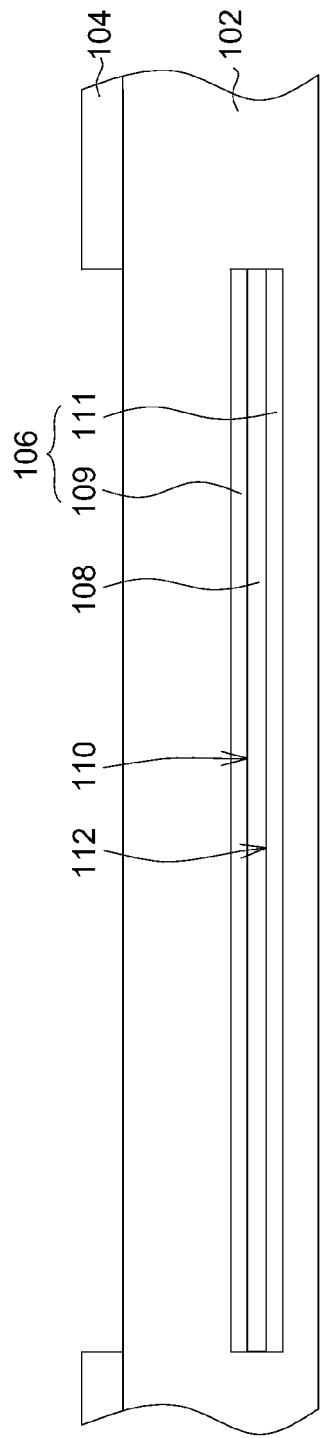
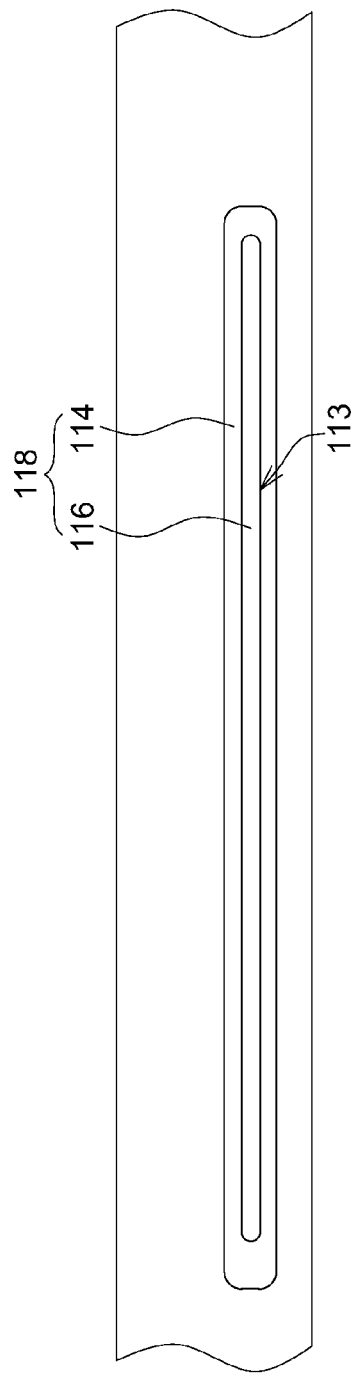
FIG. 1A
FIG. 1B

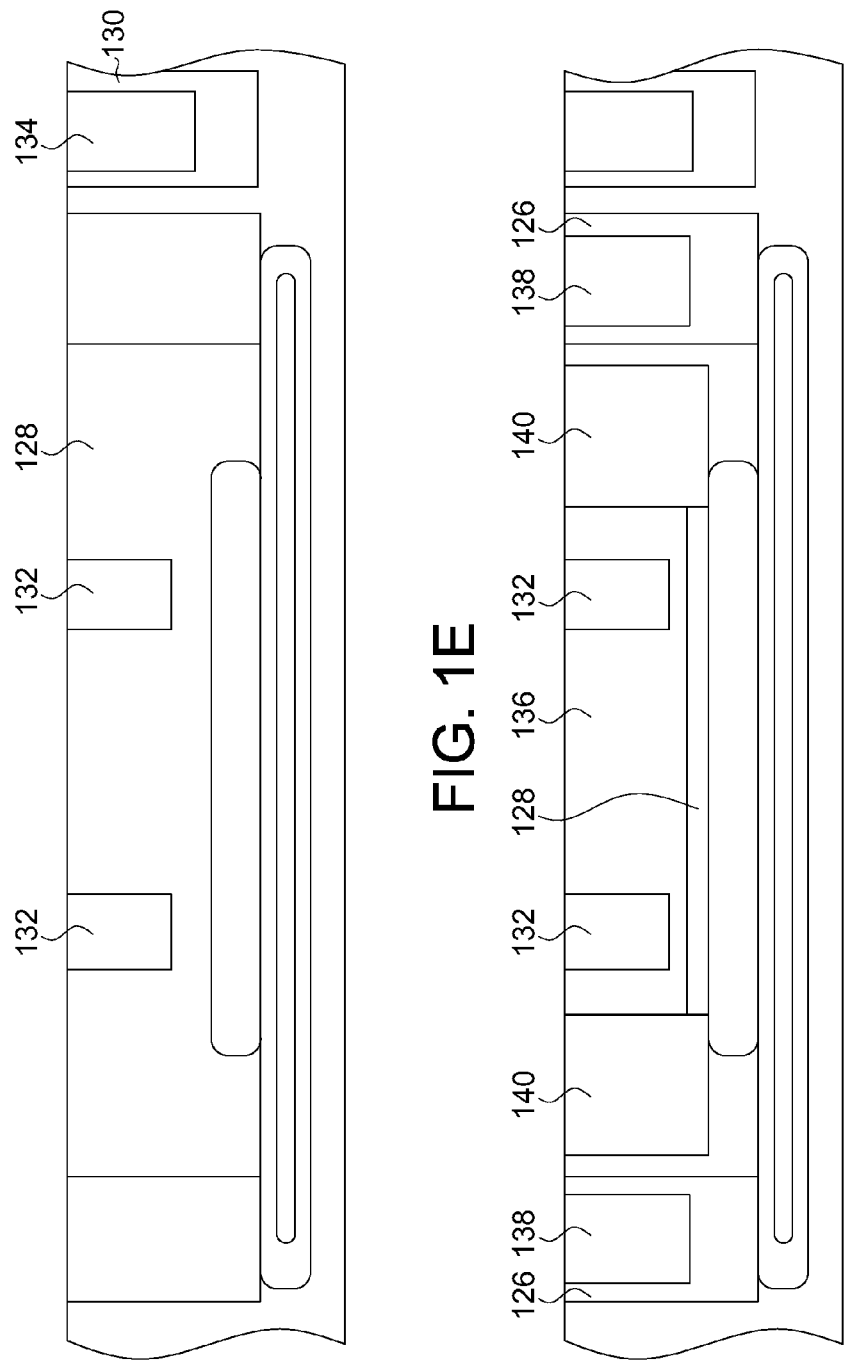

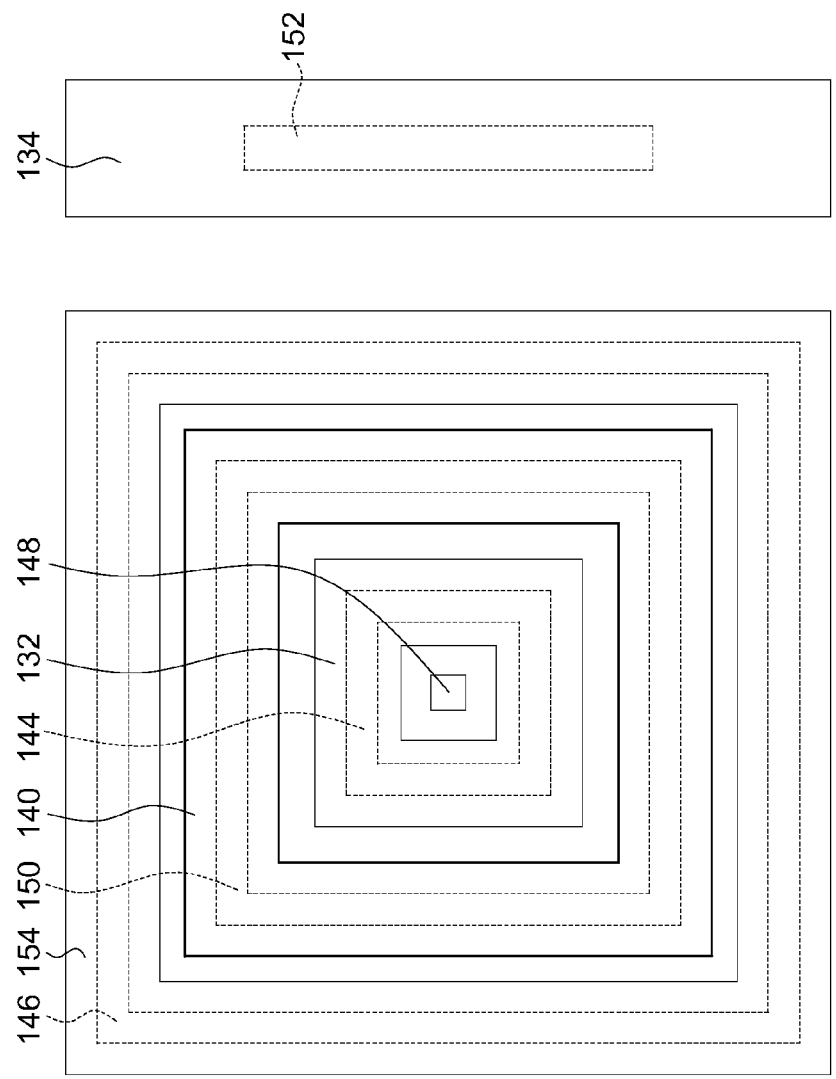

SEMICONDUCTOR STRUCTURE AND METHOD FOR FORMING THE SAME

BACKGROUND

Technical Field

The disclosure relates to a semiconductor structure and a method for forming the same.

Description of the Related Art

In semiconductor technology, a bipolar junction transistor (BJT) is a three-terminal electronic device constructed of doped semiconductor material. Bipolar transistors are so named because their operation involves both electrons and holes. Charge flow in a bipolar junction transistor is due to bidirectional diffusion of charge carriers across a junction between two regions of different charge concentrations. Bipolar junction transistors may be used in amplifying or switching applications.

SUMMARY

According to one embodiment, a semiconductor structure is provided. The semiconductor structure comprises a bipolar transistor. The bipolar transistor comprises a base doped contact, an emitter doped contact, a collector doped contact, and well regions. The base doped contact, the emitter doped contact and the collector doped contact are formed in the different well regions having different dopant conditions from each other.

According to another embodiment, a semiconductor structure is provided. The semiconductor structure comprises a semiconductor device and an isolation structure. The semiconductor device is isolated by the isolation structure. The isolation structure comprises an isolation buried layer. The isolation buried layer comprises a first diffused layer and a second diffused layer. The second diffused layer is surrounded by the first diffused layer. The first diffused layer and the second diffused layer have different dopant conditions.

According to yet another embodiment, a method for forming a semiconductor structure is provided. The method comprises following steps. A semiconductor substrate is doped with a first dopant to form a first doped layer. The semiconductor substrate is doped with a second dopant heavier than the first dopant to form a second doped layer adjacent to the first doped layer. The first doped layer is diffused to form a first diffused layer. The second doped layer is diffused to form a second diffused layer surrounded by the first diffused layer.

BRIEF DESCRIPTION OF THE DRAWINGS

FIG. 1A to FIG. 1H illustrate a method for forming a semiconductor structure.

FIG. 2 illustrates a top view of a semiconductor structure.

DETAILED DESCRIPTION

Figure 1C:
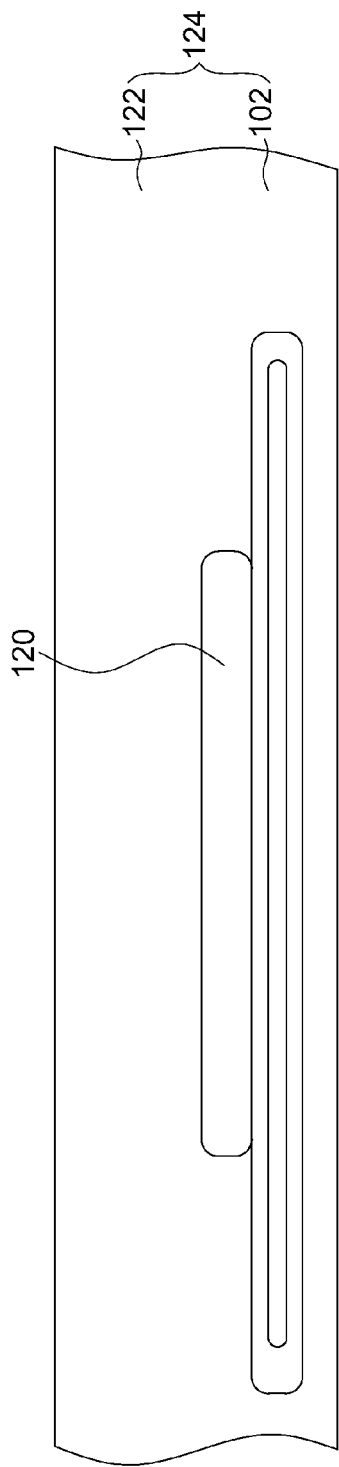

FIG. 1A to FIG. 1H illustrate a method for forming a semiconductor structure.

Referring to FIG. 1A, a semiconductor substrate 102 is provided. In one embodiment, the semiconductor substrate 102 has a first type conductivity. The semiconductor substrate 102 may comprises silicon or other suitable semiconductor materials.

Referring to FIG. 1A, an implantation mask 104 is formed on the semiconductor substrate 102. A first doped layer 106 comprising an upper layer 109 and a lower layer 111, and a second doped layer 108 are formed by doping a first dopant and a second dopant respectively into the semiconductor substrate 102 with the same implantation mask 104 so that sidewalls of the upper layer 109 and the lower layer 111 of first doped layer 106 are aligned with sidewalls of the second doped layer 108. In one embodiment, the first dopant and the second dopant are dopants of a second type conductivity opposite to the first type conductivity. In one embodiment, for example, the second doped layer 108, the upper layer 109 of the first doped layer 106 on the second doped layer 108, and the lower layer 111 of the first doped layer 106 under the second doped layer 108 are formed by respective implantation processes, for example three implantation processes, with different doping energies so as to control doping depths, or with different impurity elements or dosages.

As shown in FIG. 1A, the upper layer 109 and the lower layer 111 of the first doped layer 106 and the second doped layer 108 form a sandwich structure, in other words, the upper layer 109 of the first doped layer 106 is beyond an upper surface and the lower layer 111 of the first doped layer 106 is beyond a lower surface of the second doped layer 108. The second doped layer 108 has a dopant condition different from dopant conditions of the upper layer 109 and the lower layer 111 of the first doped layer 106, and therefore there are interfaces 110 and 112 between the upper layer 109 and the lower layer 111 of the first doped layer 106 and the second doped layer 108, and the similar concept will not be described hereafter. For example, the second dopant for the second doped layer 108 is heavier than the first dopant for the upper layer 109 and the lower layer 111 of the first doped layer 106. In one embodiment, for example, the first dopant is a phosphorus atom, and the second dopant is a stibium atom having an atomic mass heavier than an atomic mass of the phosphorus atom. In one embodiment, for example, the lower layer 111 of the first doped layer 106 is formed by one implantation step with a higher energy and a low dosage of a phosphorus impurity, then the second doped layer 108 shallower than the lower layer 111 of the first doped layer 106 is formed by another implantation step with a medium energy and a high dosage of a stibium impurity, and then the upper layer 109 of the first doped layer 106 shallower than the second doped layer 108 is formed by yet another implantation step with a lower energy and a low dosage of a phosphorus impurity. Then, the implantation mask 104 is removed.

Referring to FIG. 1B, the upper layer 109 and the lower layer 111 (FIG. 1A) of the first doped layer 106 and the second doped layer 108 are driven-in (or diffused) to respectively form a first diffused layer 114 and a second diffused layer 116 of an isolation buried layer 118 by a thermal process. In one embodiment, the second dopant for the second doped layer 108 (FIG. 1A) is heavier than the first dopant for the upper layer 109 and the lower layer 111 of the first doped layer 106, and therefore during the driving-in step the first dopant moves faster than the second dopant so that the driven-in first diffused layer 114 formed by diffusing the upper layer 109 and the lower layer 111 of the first doped layer 106 is extended to surround sidewalls, an upper surface and a lower surface of the second diffused layer 116. For example, there is a closed (or ring shape) interface between the first diffused layer 114 and the second diffused layer 116, as observed from the cross-section view as shown in FIG. 1B. The thermal diffusing process may be performed at other suitable timings. The thermal diffusing process can be controlled to make a profile of the first diffused layer 114 physically connect with the first isolation well 126 (FIG. 1D).

Referring to FIG. 1C, a doped buried layer 120 is formed by doping a dopant of the first type conductivity, such as a boron atom etc., into the semiconductor substrate 102. In one embodiment, for example, the doped buried layer 120 is formed by two implantation process. One is for forming an upper (shallower) portion of the doped buried layer 120, and the other is for forming a lower (deeper) portion of the doped buried layer 120. A thermal diffusion process may be performed, at any suitable timing, to diffuse the upper (shallower) portion of the doped buried layer 120 to physically connect with the third well region 140 (FIG. 1F). An epitaxial layer 122 of the first type conductivity may be formed from an upper surface of the semiconductor substrate 102 to form a semiconductor substrate 124 comprising the epitaxial layer 122 and the semiconductor substrate 102.

Figure 1D:
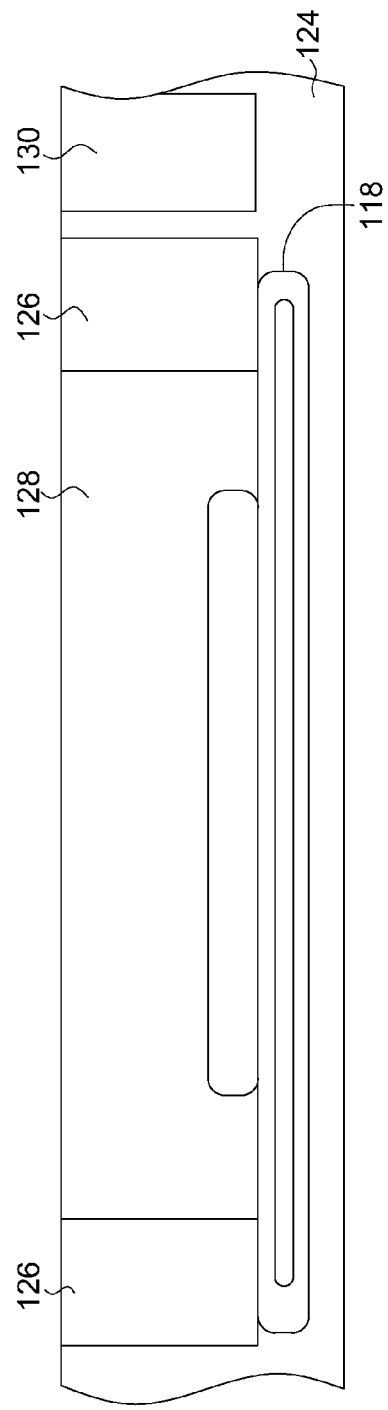

Referring to FIG. 1D, the semiconductor substrate 124 is doped with an impurity of the second type conductivity to form a first isolation well 126 on the isolation buried layer 118. In addition, the semiconductor substrate 124 is doped with an impurity of the first type conductivity to form a doped well 128 in a region defined by the first isolation well 126 and the isolation buried layer 118, and to form a first doped region 130 outside of the first isolation well 126. The doped well 128 and the first doped region 130 may be formed at the same time by an implantation step using the same mask.

Referring to FIG. 1E, a first well region 132 may be formed by doping an impurity of the second type conductivity into the doped well 128. A second doped region 134 is formed by doping an impurity of the first type conductivity into the first doped region 130.

Referring to FIG. 1F, a second well region 136 may be formed by doping an impurity of the second type conductivity into the doped well 128. As shown in FIG. 1F, the first well region 132 is in the second well region 136. A second isolation well 138 may be formed by doping an impurity of the second type conductivity into the first isolation well 126. In one embodiment, the second well region 136 and the second isolation well 138 are formed simultaneously by an implantation step using the same mask. A third well region 140 may be formed by doping an impurity of the first type conductivity into the doped well 128.

Figure 1G:
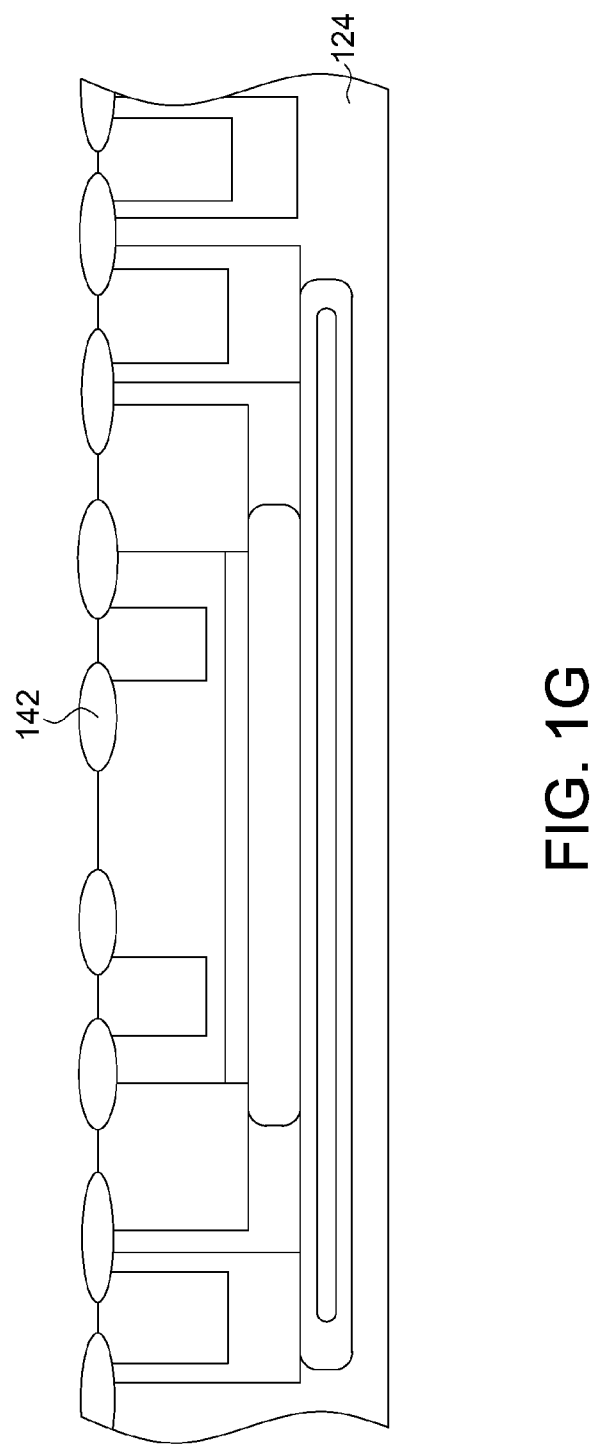

Referring to FIG. 1G, an insulation structure 142 is formed on the semiconductor substrate 124. The insulation structure 142 is not limited to a field oxide (FOX) structure as shown in FIG. 1G, and may use other suitable dielectric structures such as a shallow trench isolation (STI) structure, a deep trench isolation structure, etc.

Figure 1H:
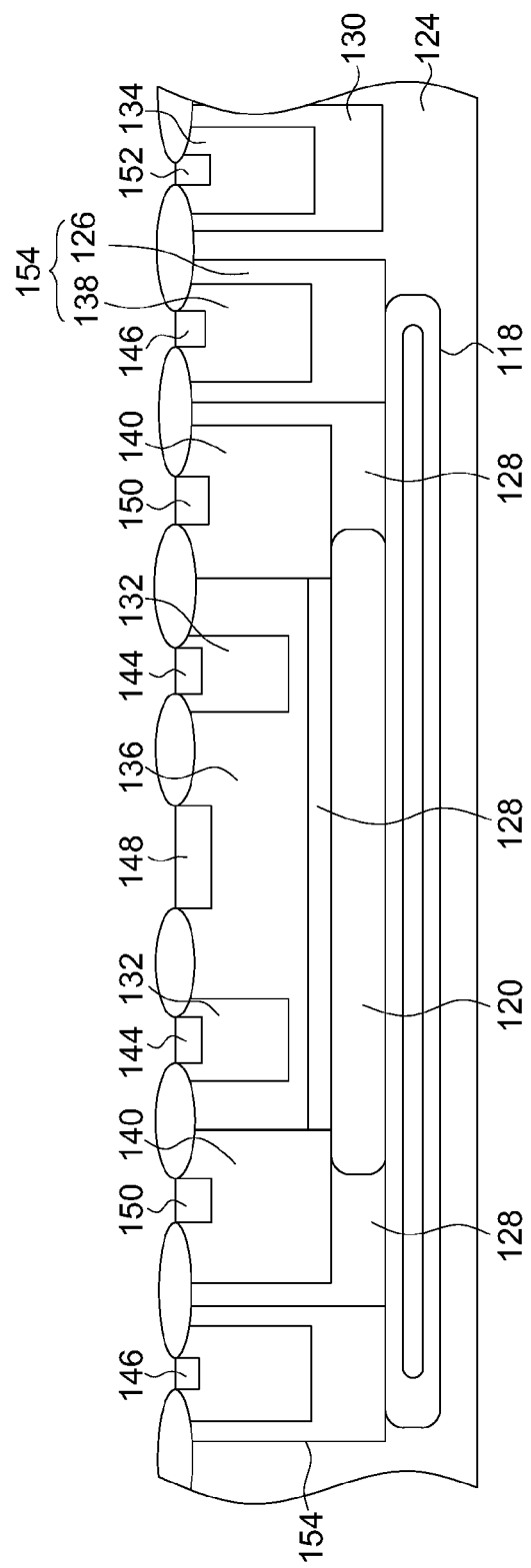

Referring to FIG. 1H, a doped contact 144 and a doped contact 146 are formed by doping an impurity of the second type conductivity into the first well region 132 and the second isolation well 138, respectively. The doped contact 144 and the doped contact 146, which are heavily doped, may be formed simultaneously.

A doped contact 148, a doped contact 150, and a doped contact 152 are formed by doping an impurity of the first type conductivity into the second well region 136, the third well region 140, and the second doped region 134, respectively. The doped contact 148, the doped contact 150 and the doped contact 152, which are heavily doped, may be formed simultaneously.

Referring to FIG. 1H, the semiconductor structure comprises a vertical bipolar transistor comprising a base, an emitter and a collector. The base of the bipolar transistor comprises the first well region 132, the second well region 136 and the (base) doped contact 144, all having the second type conductivity. The emitter of the bipolar transistor comprises the (emitter) doped contact 148 having the first type conductivity. The collector of the bipolar transistor comprises the doped buried layer 120, the doped well 128, the third well region 140 and the (collector) doped contact 150, all having the first type conductivity.

The semiconductor structure comprises an isolation structure surrounding a lower surface and sidewalls of the bipolar transistor so as to isolate the bipolar transistor from the semiconductor substrate 124. The isolation structure comprises the isolation buried layer 118, an isolation well 154 comprising the first isolation well 126 and the second isolation well 138, and the (isolation) doped contact 146 formed in the second isolation well 138, all having the second type conductivity. In other embodiments, the isolation structure may comprise insulating (or dielectric) materials, such as an oxide or a nitride, such as silicon oxide, silicon nitride, silicon oxynitride, or other suitable materials. For example, the isolation buried layer 118 may be formed by a dielectric material and is physically connected under the isolation well 154. Alternatively, the isolation well 154 may be formed by a dielectric material and the (isolation) doped contact 146 may be omitted. The isolation structure is not limited to isolate the bipolar transistor, and may be used to isolate other semiconductor devices according to proper designs.

The semiconductor substrate 124 has the (substrate) doped contact 152, the second doped region 134 and the first doped region 130, formed therein, and all having the first type conductivity. A voltage of the semiconductor substrate 124 may be controlled through the (substrate) doped contact 152.

The first well region 132 of the base of the bipolar transistor can prevent punch-through between the emitter and the collector in a lateral direction. The third well region 140 of the collector of the bipolar transistor can prevent punch-through between the base of the bipolar transistor and the isolation well 154 of the isolation structure in a lateral direction. The isolation well 154 can prevent punch-through between the collector of the bipolar transistor and the semiconductor substrate 124 in a lateral direction. The isolation buried layer 118 and the doped buried layer 120 can prevent vertical punch-through for the bipolar transistor.

In one embodiment, the semiconductor structure has a top view as shown in FIG. 2 which only shows the first well region 132, the second doped region 134, the third well region 140, the doped contact 144, the doped contact 146, the doped contact 148, the doped contact 150, the doped contact 152, and the isolation well 154. As shown in FIG. 2, the first well region 132, the third well region 140, the doped contact 144, the doped contact 146, the doped contact 150, and the isolation well 154 have ring shapes, respectively.

In one embodiment, the first type conductivity is P type conductivity, and the second type conductivity is N type conductivity, and therefore the bipolar transistor is a PNP bipolar transistor isolated from the P type semiconductor substrate 124 (FIG. 1H) by the N type isolation structure. In another embodiment, the first type conductivity is N type conductivity and the second type conductivity is P type conductivity.

Steps for the semiconductor structure is not limited to the sequence described above, and may be varied properly according to actual demands. Other elements or steps may be formed before, after, among or during the above mentioned steps. For example, after the first isolation well 126 and the doped well 128 (FIG. 1D) are formed, a thermal driving-in process may be performed. After the first well region 132 and the second doped region 134 (FIG. 1E) are formed, a thermal diffusing process may be performed. Before or after the insulation structure 142 (FIG. 1G), a thermal driving-in process may be performed. A LDD region such as a NLDD region may be formed between the step for the insulation structure 142 (FIG. 1G) and the step for the doped contacts 144, 146, 148, 150, 152 (FIG. 1H). In some embodiments, after the doped contacts 144, 146, 148, 150, 152 are formed, metal contacts (or vias or plugs; not shown) passing through a dielectric layer (not shown) may be formed to physically and electrically connected with the doped contacts 144, 146, 148, 150, 152 so that the doped contacts 144, 146, 148, 150, 152 can be electrically connected to metal layers of other levels or external signal terminals. The semiconductor structure may be formed by a Bipolar-CMOS-DMOS (BCD) process.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
    a bipolar transistor comprising a base doped contact, an emitter doped contact, a collector doped contact and well regions, wherein the base doped contact, the emitter doped contact and the collector doped contact are formed in the different well regions having different dopant conditions from each other, the collector doped contact has a first type conductivity; and
    an isolation structure isolating the bipolar transistor, wherein the isolation structure has a second type conductivity opposite to the first type conductivity, the isolation structure comprises an isolation buried layer comprising a first diffused layer and a second diffused layer, the first diffused layer and the second diffused layer have the second type conductivity and different dopant conditions, all upper and lower surfaces and sidewalls of the second diffused layer are surrounded by the first diffused layer.

2. The semiconductor structure according to claim 1, wherein the well regions comprises a first well region and a second well region, the bipolar transistor comprises a base comprising the first well region, the second well region and the base doped contact, the first well region is in the second well region, the base doped contact is in the first well region, the emitter doped contact is in the second well region.

3. The semiconductor structure according to claim 2, wherein the first well region and the second well region have different dopant concentrations of the same type conductivity.

4. The semiconductor structure according to claim 1, wherein the well regions comprises a third well region, the bipolar transistor comprises a collector comprising the third well region and the collector doped contact in the third well region.

5. The semiconductor structure according to claim 1, wherein the well region comprises a third well region, the bipolar transistor comprises a collector comprising a doped well, the third well region in the doped well, the collector doped contact in the third well region, and a doped buried layer below the third well region.

6. The semiconductor structure according to claim 1, wherein a dopant of the second diffused layer is heavier than a dopant of the first diffused layer.

7. The semiconductor structure according to claim 1, wherein the isolation structure further comprises an isolation well on the isolation buried layer, the isolation buried layer and the isolation well have the second type conductivity.

8. The semiconductor structure according to claim 7, wherein the isolation well comprises a first isolation well and a second isolation well in the first isolation well, the isolation structure further comprises an isolation doped contact in the second isolation well, the isolation buried layer, the first isolation well, the second isolation well and the isolation doped contact have the same type conductivity.

9. The semiconductor structure according to claim 1, further comprising:
    a semiconductor substrate;
    a first doped region in the semiconductor substrate;
    a second doped region in the first doped region; and
    a substrate doped contact in the second doped region, the semiconductor substrate, the first doped region, the second doped region and the substrate doped contact have the same type conductivity; wherein the isolation structure isolates the bipolar transistor from the semiconductor substrate.

* * * * *